United States Patent
Thompson et al.

(10) Patent No.: US 7,824,778 B2
(45) Date of Patent: *Nov. 2, 2010

(54) BINUCLEAR COMPOUNDS

(75) Inventors: Mark E. Thompson, Anaheim, CA (US); Bert Alleyne, Los Angeles, CA (US); Peter Djurovich, Los Angeles, CA (US)

(73) Assignee: The University of Southern California, Los Angeles, CA (US)

( * ) Notice: Subject to any disclaimer, the term of this patent is extended or adjusted under 35 U.S.C. 154(b) by 560 days.

This patent is subject to a terminal disclaimer.

(21) Appl. No.: 11/435,210

(22) Filed: May 15, 2006

(65) Prior Publication Data

US 2006/0269785 A1    Nov. 30, 2006

Related U.S. Application Data

(62) Division of application No. 10/404,785, filed on Apr. 1, 2003, now Pat. No. 7,090,928.

(51) Int. Cl.
H01L 51/54    (2006.01)

(52) U.S. Cl. .................. 428/690; 428/917; 313/504; 257/E51.044

(58) Field of Classification Search .................. None
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,489,638 B2 | 12/2002 | Seo et al. | |
| 6,489,683 B1 | 12/2002 | Lopatin et al. | |
| 6,783,873 B2 | 8/2004 | Tsuboyama et al. | |
| 6,821,645 B2 | 11/2004 | Igarashi et al. | |
| 7,090,928 B2 * | 8/2006 | Thompson et al. ........ | 428/690 |
| 2002/0051896 A1 * | 5/2002 | Seo ........................... | 428/690 |
| 2002/0193532 A1 | 12/2002 | Ikehira et al. | |
| 2003/0017361 A1 | 1/2003 | Thompson et al. | |
| 2003/0152802 A1 | 8/2003 | Tsuboyama et al. | |
| 2003/0162299 A1 | 8/2003 | Hsieh et al. | |
| 2003/0230980 A1 | 12/2003 | Forrest et al. | |
| 2004/0174116 A1 | 9/2004 | Lu et al. | |
| 2005/0164031 A1 | 7/2005 | Thompson et al. | |

2008/0233287 A1    9/2008    Shtein et al.

FOREIGN PATENT DOCUMENTS

| EP | 1 026 222 A2 | 8/2000 |
|---|---|---|
| EP | 1 052 661 A2 | 11/2000 |
| JP | 2002 083684 | 3/2002 |
| JP | 2003 064091 | 3/2003 |
| WO | WO 03/014256 A1 | 2/2003 |

OTHER PUBLICATIONS

M. A. Baldo et al., "Highly efficient phosphorescent emission from organic electroluminescent devices," *Nature*, vol. 395, pp. 151-154 (Sep. 1998).

M.A. Baldo et al., "Very high-efficiency green organic light-emitting devices based on electrophosphorescence", *Applied Physics Letters*, vol. 75, No. 1, pp. 4-6 (1999).

C. Adachi et al., "Nearly 100% Internal Phosphorescence Efficiency in an Organic Light Emitting Device", *J. Appl. Phys.*, vol. 90, No. 10, pp. 5048-5051 (2001).

Matsumoto et al., "Organometallic chemistry of platinum-blue derived platinumIII dinuclear complexes," Coordination Chemisry Reviews 231 (2002), pp. 229-238.

Tejel et al., "From Platinum Blues to Rhodium and Iridium Blues," Chem. Eur. J. (1999) vol. 5 No. 4, pp. 1131-1135.

Belitto et al., "Metal-Metal Interactions in One Dimension. 3. Segregated Canted Stacks of Tetrakis (dithioacetato) diplatinum (11)," Inorg. Chem (1980) 19, pp. 3632-3636.

Oskui et al., "Di-and Tripalladium(II) and -platinum(II) Complexes Containing 7- Amino-1, 8-naphthyrdin-2-one as a Bridging Ligand—Oxidation of a [Pt3]6+ Core to [Pt3]8+," Eur. J. Inorg. Chem. (1999) pp. 1325-1333.

(Continued)

*Primary Examiner*—Marie R. Yamnitzky
(74) *Attorney, Agent, or Firm*—Kenyon & Kenyon LLP

(57) ABSTRACT

Devices are provided having an anode, a cathode, and an emissive layer disposed between and electrically connected to the anode and the cathode. The emissive layer includes an emissive material having more than one metal center. In one embodiment, first and second metal centers are independently selected from the group consisting of d7, d8, and d9 metals. A bridging ligand is coordinated to the first metal center and to the second metal center. In one embodiment, the first and second metal centers each have coordination numbers of at least 3, and more preferably each have coordination numbers of 4. In one embodiment, photoactive ligands are coordinated to the first and second metal centers. In one embodiment, there are no photoactive ligands. In one embodiment, a charge neutral bi-nuclear emissive material is provided. In one embodiment the first and metal centers have a co-facial configuration, and preferably a square planar cofacial configuration. In one embodiment, the metal centers are selected from metals having an atomic number greater than or equal to 40.

22 Claims, 19 Drawing Sheets

OTHER PUBLICATIONS

Navarro et al., "Binuclear Platinum(II) Triazolopyrimidine Bridged Complexes. Preparation, crystal Structure, NMR Spectroscopy, and ab Initio MO Investigation on the Bonding Nature of the Pt(II) . . . Pt(II) Interaction in the Model Compound {Pt2[NHCHN(CH2)(CH3))]4}," Inorg. Chem. (1996) 35, pp. 7829-7835.

Lewis et al., "Oligomerization and Two-Center Oxidative Addition Reactions of a Dimeric Rhodium(1) Complex," J. Am. Chem. Soc. (1976) 98, pp. 7461-7463.

Wai Lai et al., "Probing d 8 -d 8 Interactions in Luminescent Mono- and Binuclear Cyclometalated Platinum(II) Complexes of j6-Phenyl-2,2'-bipyridines," Inorg. Chem. (1999) 38, pp. 4046-4055.

Mann et al., "Characterization of Oligomers of Tetrakis(phenyl isocyanide)rhodium(I) in Acetonitrile Solution," J. Am. Chem. Soc. (1975) 97, pp. 3553-3555.

Novozhilova et al., "Theoretical Analysis of the Triplet Excited State of the [P+2(H2P2O5)4]4- Ion and comparison with Time-Resolved X-ray and Spectroscopic Results," J. Am. Chem. Soc. (2003) 125, 1079-1087.

Rice et al, "Electronic Absorption and Emission Spectra of Binuclear Platinum(II) Complexes. Characterization of the Lowest Singlet and Triplet Excited States of P+2( H2P2O5)44-," J. Am. Chem. Soc. (1983) 105, pp. 4571-4575.

Andrew Gilbert and Jim Baggott, Essentials of Molecular Photochemistry, 1991, CRC Press, Boston, pp. 145-167.

Brooks et al., "Synthesis and Characterization of Phosphorescent Cyclometalated Platinum Complexes," Inorganic Chemistry, 2002, 41(12), 3055-3066.

Umakoshi et al., "Binuclear Platinum(II) and -(III) Complexes of Pyridine-2-thiol and Its 4-Methyl Analogue, Synthesis, Structure, and Electrochemistry," Inorg. Chem. 1987, vol. 26, 3551-3556.

Ma et al., "High Luminescence Gold (I) and Copper(I) Complexes with a Triplet Excited State for use in Light-Emitting Diodes" Advamced Materials, 1999, vol. 11, No. 10, pp. 852-857.

Ma, et al., "Triplet Luminescent dinuclear-gold(I) complex-based light-emitting diodes with low turn -on voltage" Appl. Phy. Ltr., 1999, vol. 74, No. 10, pp. 1361-1363.

Kato et al., "Vapor-Induced Luminescence Switching in Crystals of the Syn Isomer of a Dinuclear (Bipyridine) platinum(II) Complex Bridged with Pyridine-2-Thiolate Ions" Angew. Chem. Int. Ed., 2002, vol. 41, No. 17, pp. 3183-3185.

Yue Lin et al., "Structural, Photophysical, and Electrophosphorescent Properties of Platinum(II) Complexes Supported by Tetradentate N2O2 Chelates" Chem. Eur. J., 2003, vol. 9 No. 6, pp. 1264-1272.

Fery-Forgues, S., et al., Ferrocene and ferrocenyl derivatives in luminescent systems, J. Photochem. and Photobio. Chem. vol. 132, pp. 137-159 , 2000.

Umakoshi et al., 1987, "Binuclear Platinum (II) and-(III) Complexes of Pyridine-2-Thiol and its 4-Methyl Analog. Synthesis, Structure, and Electrochemistry", Inorganic Chemistry, 26(1):3551-3556.

* cited by examiner

BINUCLEAR COMPOUNDS

CROSS REFERENCE TO RELATED APPLICATIONS

This application is a division of U.S. application Ser. No. 10/404,785, filed Apr. 1, 2003 now U.S. Pat. No. 7,090,928, which is incorporated herein by reference in its entirety.

RESEARCH AGREEMENTS

The claimed invention was made by, on behalf of, and/or in connection with one or more of the following parties to a joint university-corporation research agreement: Princeton University, The University of Southern California, and Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs), and more specifically to phosphorescent organo-metallic materials used in such devices. More specifically, the present invention relates to OLEDs, wherein the emissive layer comprises a phosphorescent emitting material having a plurality of metal centers.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

OLEDs make use of thin organic films that emit light when voltage is applied across the device. OLEDs are becoming an increasingly interesting technology for use in applications such as flat panel displays, illumination, and backlighting.

Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic device. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may comprise a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

SUMMARY OF THE INVENTION

Devices are provided having an anode, a cathode, and an emissive layer disposed between and electrically connected to the anode and the cathode. The emissive layer includes an emissive material having more than one metal center. In one embodiment, first and second metal centers are independently selected from the group consisting of d7, d8, and d9 metals. A bridging ligand is coordinated to the first metal center and to the second metal center. In one embodiment, the first and second metal centers each have coordination numbers of at least 3, and more preferably each have coordination numbers of 4. In one embodiment, photoactive ligands are coordinated to the first and second metal centers. In one embodiment, there are no photoactive ligands. In one embodiment, a charge neutral bi-nuclear emissive material is provided. In one embodiment the first and metal centers have a co-facial configuration, and preferably a square planar co-facial configuration. In one embodiment, the metal centers are selected metals having an atomic number greater than or equal to 40.

DETAILED DESCRIPTION

Figure 1:
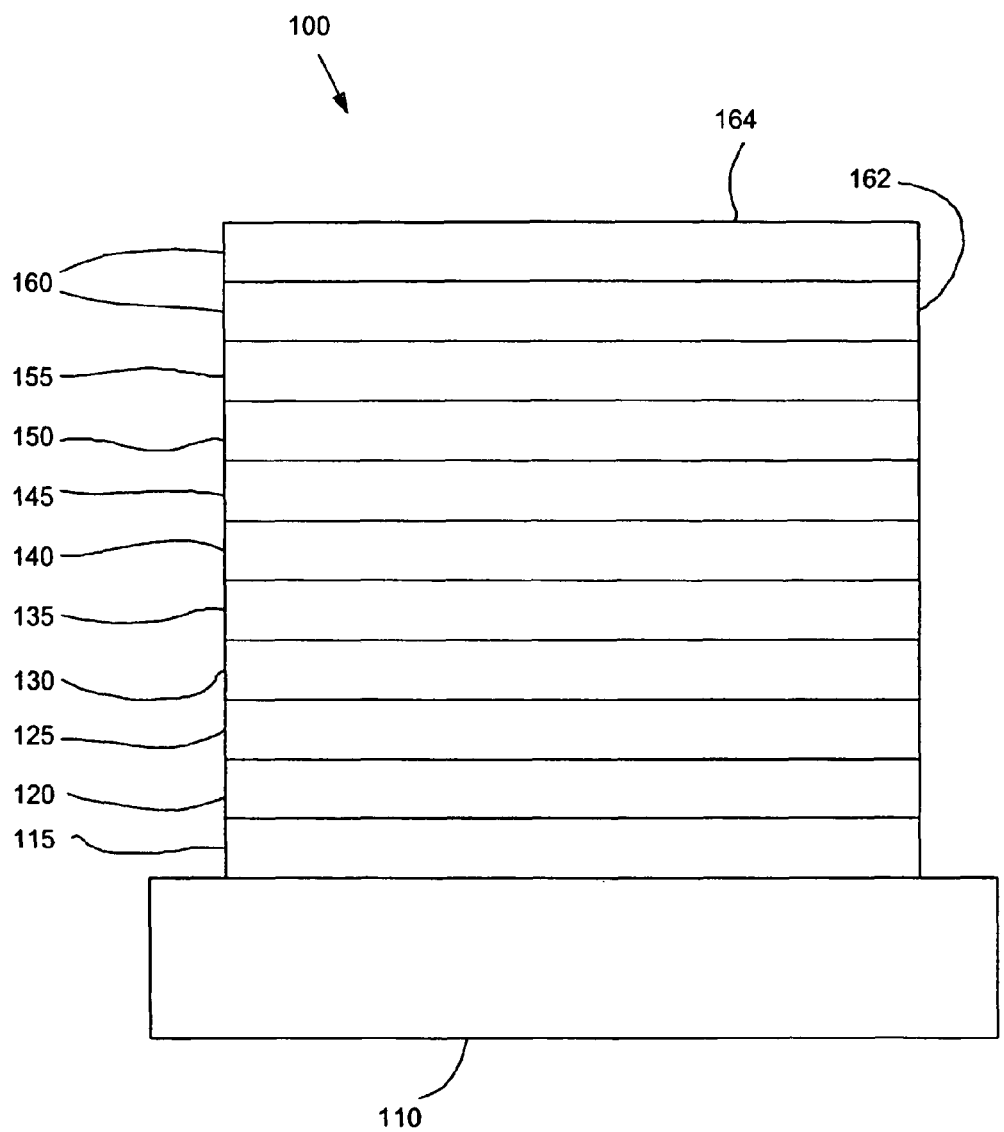
FIG. 1 shows an organic light emitting device having separate electron transport, hole transport, and emissive layers, as well as other layers.

Generally, an OLED comprises at least one organic layer disposed between and electrically connected to an anode and a cathode. As used herein, the term "disposed between and electrically connected to" does not indicate that the recited layers are necessarily adjacent and in direct contact. Rather, it allows for the disposition of additional layers between the recited layers. When a current is applied to the device, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-Bipyridine is such a molecule. Non-radiative decay mechanisms are typically temperature dependent, such that a material that exhibits phosphorescence at liquid nitrogen temperatures may not exhibit phosphorescence at room temperature. But, as demonstrated by Baldo, this problem may be addressed by selecting phosphorescent compounds that do phosphoresce at room temperature.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent, or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pate. No. 5,844,363, which is incorporated by reference in its entirety. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in U.S. patent application Ser. No. 10/173,682 to Forrest et al.(published as U.S. 2003/0230980), which is incorporated by reference in its entirety. Other hole transport layers may be used.

Emissive layer 135 will comprise at least one emissive material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Thus, in one embodiment of the present invention, the emissive layer comprises a binuclear emissive material and a second emissive material, such that the combined emission sufficiently spans the visible spectrum to give a white emission. Examples of fluorescent emissive materials include DCM and DMQA. Examples of host materials include Alq3, CBP, and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. Other emissive layer materials and structures may be used.

Electron transport layer 140 may include a material capable of transporting electrons. Electron transport layer 140 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in U.S. patent application Ser. No. 10/173,682 to Forrest et al.(published as U.S. 2003/0230980), which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) level of the electron transport layer. The "charge carrying component" is the material responsible for the LUMO that actually transports electrons. This component may be the base material, or it may be a dopant. The LUMO level of an organic material may be generally characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Most preferably, the electron affinity of the charge carrying component of the electron transport layer is greater than the work function of the cathode material. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 140. Blocking layers may also be used to block excitons from diffusing out of the emissive layer. The theory and use of blocking layers is described in more detail in U.S. Pat. No. 6,097,147 and U.S. patent application Ser. No. 10/173,682 to Forrest et al.(published as U.S. 2003/0230980), which are incorporated by reference in their entireties.

Generally, injection layers comprise a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al. now U.S. Pat. No. 7,071,615, which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may be used to planarize or wet the anode surface as well as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al. now U.S. Pat. No. 7,071,615, which is incorporated by reference in its entirety.

Figure 2:
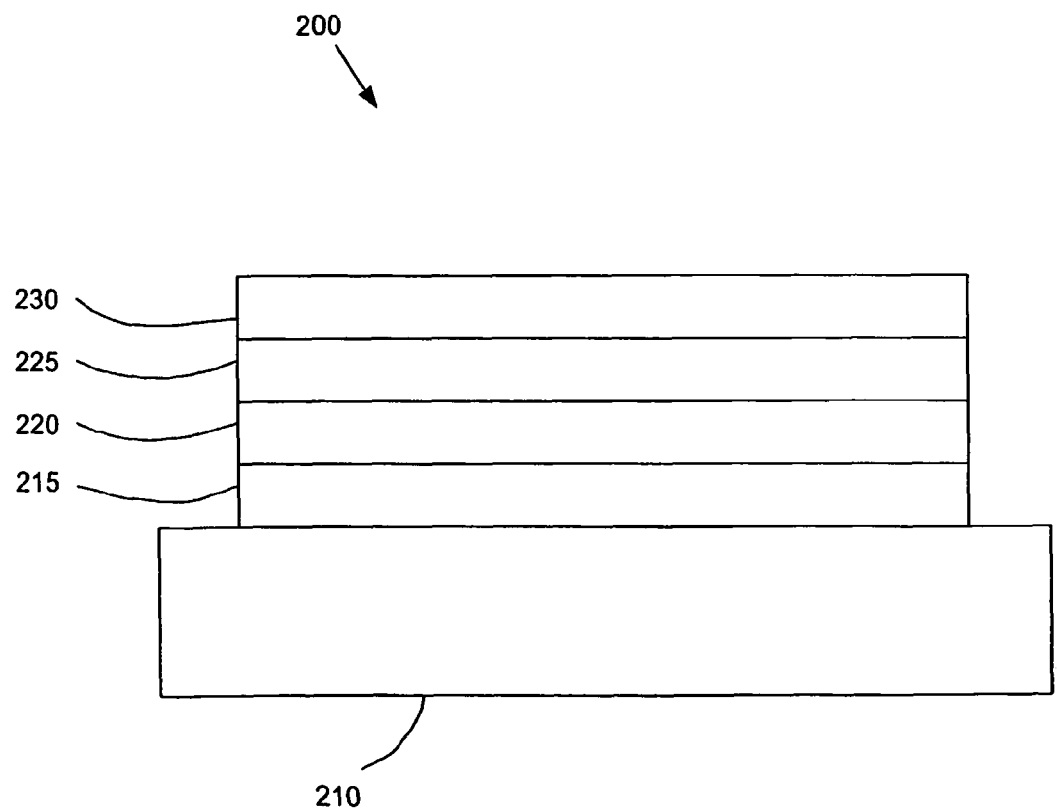
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs, comprising polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470 now U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

As used herein, "solution processible" means capable of being dissolved, dispersed, or transported in and/or deposited from a liquid medium, either in solution or suspension form.

The term "binuclear" as used herein refers to a complex having exactly two metal centers. The binuclear compounds of the present invention comprise two metal centers, wherein each metal center is bound to at least one bridging ligand that is bound to both of the metal centers. In one embodiment, each metal center is also bound to at least one "photoactive" ligand in addition to the at least one bridging ligand. The ligands bound to each metal center may provide that metal center with a roughly square planar configuration. In some embodiments of the invention, there may be more than two metal centers, but such embodiments would not be described as "binuclear."

Emissive materials of embodiments of the present invention may comprise at least one "bridging ligand." This ligand is referred to as bridging because it is bound to two different metal centers. The bridging ligand(s) may be capable of bonding to two metal centers such that the two metal centers are in close proximity, typically within about 4 Å. Distances of 4 Å and less between the metal centers allow for significant overlap of the d-orbitals of the individual metal atoms. Preferably, the two metal centers of a binuclear complex are about 2.5 to about 2.8 Å apart. The choice of bridging ligands allows for the adjustment of the distance between the two metal centers. By changing the bridging ligands, the energy of the emission from the binuclear complex can be tuned.

Figure 16:
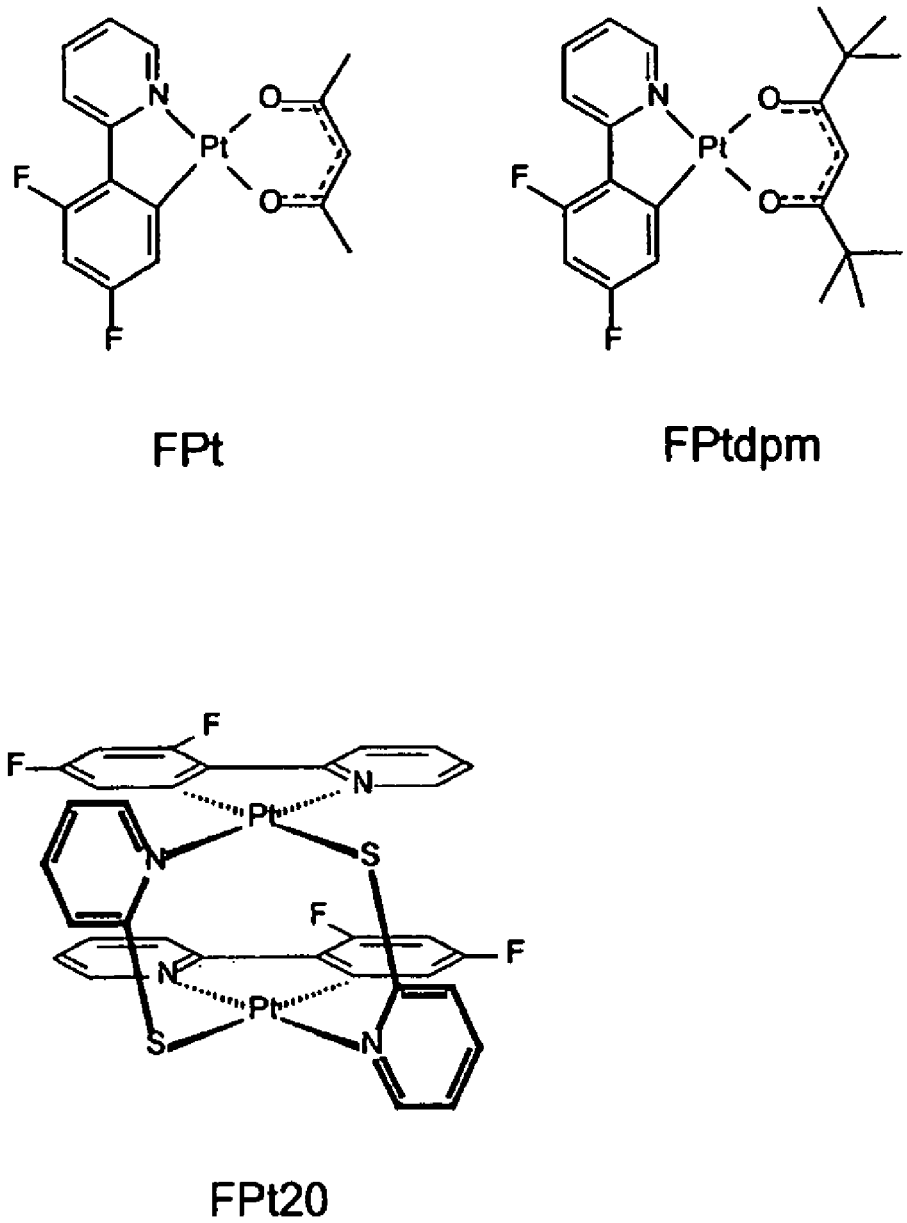
FIG. 16 shows the chemical structure of FPt, FPtdpm, and $(F_2ppy)_2Pt_2(SPy)_2$.
Figure 17:
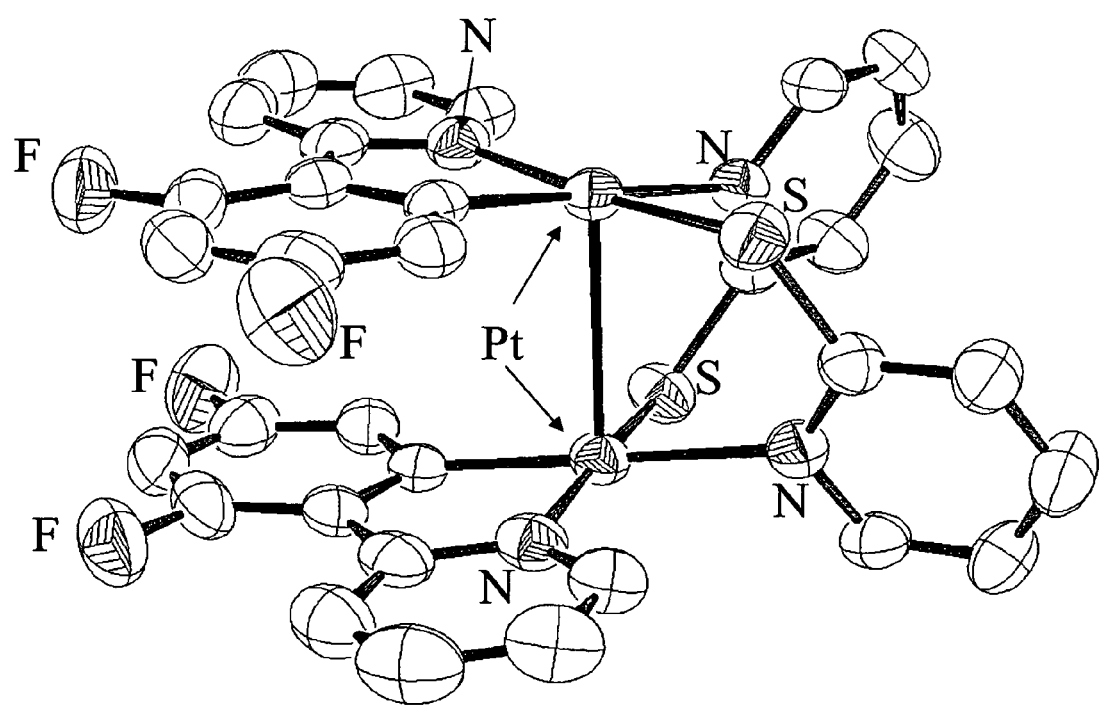
FIG. 17 shows the structure of $(F_2ppy)_2Pt_2(SPy)_2$ as determined by X-ray crystallography.

In some embodiments, two metal centers are bound together in a co-facial configuration by one or more bridging ligands. The co-facial configuration is preferred because the distance between the metal centers, and therefore the emission spectra of the molecule, is more readily tunable in a co-facial configuration. For example, depending upon the choice of bridging ligands, a co-facial configuration could result in metal-metal distances of 2 Å or less. Distance this small may be difficult to achieve with configurations that are not co-facial. "Co-facial" means that there are at least three bonds from each metal center that define a plane perpendicular to the axis between the two metal centers. A preferred co-facial configuration is a square planar co-facial configuration that may be achieved, for example, with $d^8$ metals. In the square planar configuration, each metal center has four bonds, all approximately in the same plane, and separated by one another by approximately 90 degrees. $(F_2ppy)_2Pt_2(SPy)_2$, as illustrated in FIGS. 16 and 17, is an example of a square planar co-facial binuclear metal compound.

Preferably, the metal centers are not first row transition metals, and are rather selected from the second row metals and higher on the periodic table of elements, i.e., metals having an atomic number greater than or equal to 40. Metals from the second row and higher have higher spin orbit coupling which leads to emissive materials having a higher phosphorescent yield.

Some embodiments have photoactive ligands coordinated with both metal centers. The emission of such embodiments may be tuned by using the bridging ligand to achieve and control interaction between the n orbitals of two photoactive ligands coordinated to different metal centers. It is believed that a significant π-π interaction will occur between the two photoactive ligands if they are held together at a distance of 3.5 Å or less.

It is also preferred, that the bridging ligand is not capable of acting as a bidentate ligand. Thus, it is preferable that the bridging ligand be selected so that the binding sites preferentially bond to two different metal centers rather than to the same metal center.

The bridging ligands may be referred to as "ancillary" because it is believed that they may modify the photoactive properties of the molecule, as opposed to directly contributing to the photoactive properties. However, it may be possible that the bridging ligand is part of the emissive system. The definitions of photoactive and ancillary are intended as non-limiting theories.

The bridging ligand provides a stable linkage between the two metal centers of a binuclear emissive compound. The bridging ligand may be symmetric (i.e., the binding sites to the metal centers are the same) or asymmetric (i.e., the binding sites to the metal centers are inequivalent). Thus, the bridging ligand is a molecule having at least two sites for coordination. Suitable bridging ligands may be chosen from those known in the art that are capable of providing a stable binuclear species. In this context, the term stable refers to the stability of the binuclear complex when incorporated into a light emitting device, and especially during the operation of such a device. Some suitable ligands are disclosed in: Matsumoto et al., "Organometallic chemistry of platinum-blue derived platinum III dinuclear complexes," Coordination Chemistry Reviews 231 (2002), pages 229-238 and Tejel et al., "From Platinum Blues to Rhodium and Iridium Blues," Chem. Eur. J. (1999) 5, No. 4, pages 1131-1135; Belitto et al., "Metal-Metal Interactions in One Dimension. 3. Segregated Canted Stacks of Tetrakis (dithioacetato) diplatinum (II)," Inorg. Chem. (1980) 19, pages 3632-3636; Oskui et al., "Di- and Tripalladium(II) and -platinum(II) Complexes Containing 7-Amino-1,8-naphthyridin-2-one as a Bridging Ligand—Oxidation of a [Pt3]6+ Core to [Pt3]8+," Eur. J. Inorg. Chem. (1999) 1325-1333; Navarro et al., "Binuclear Platinum(II) Triazolopyrimidine Bridged Complexes. Preparation, Crystal Structure, NMR Spectroscopy, and ab Initio MO Investigation on the Bonding Nature of the Pt(II) . . . Pt(II) Interaction in the Model Compound {Pt2[NHCHN(C(CH2)(CH3))]4}," Inorg. Chem. (1996) 35, 7829-7835; Lewis et al., "Oligomerization and Two-Center Oxidative Addition Reactions of a Dimeric Rhodium(1) Complex," J. Am. Chem. Soc. (1976) 98, 7461-7463, each of which are incorporated by reference.

In a preferred embodiment of the invention, the bridging ligand(s) is a compound of formula III

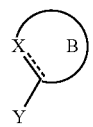

(III)

wherein X and Y are selected from atoms or moieties capable of forming a donative bond to a metal center, and B is a five- or six-membered ring. The dashed line represents an optional double bond. Preferred bridging ligands include:

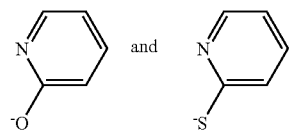

and derivatives thereof. Other preferred bridging ligands are carboxylates (RCOO⁻), thiocarboxyloic acids (RCSS⁻), pyrophosphate (⁻O₃P—O—PO₃⁻), or a compound of the formula

and derivatives thereof.

Yet other preferred bridging ligands include:

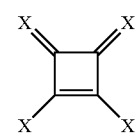

BL-1

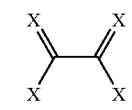

BL-2

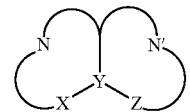

BL-3

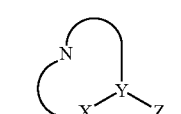

BL-4

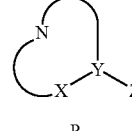

BL-5

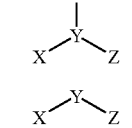

BL-6 where:

X and Z are selected from the group consisting of C, CR, O, N, NR, S, and P;

Y is selected from the group consisting of C, N, S, and P;

R is H or any organic substituent; and

N and N' are hydrocarbon chains having 4-8 members, possibly including heteroatoms.

The bridging ligand(s) ensures that the two metal centers of the binuclear emissive material are maintained in close proximity to each other. This allows the binuclear emissive material to emit from a collective excited state, rather than from single-metal (monomer) species. The two metal centers can be strongly or weakly coupled in the ground state. The conditions may lead to very different photophysical processes.

A binuclear species that is weakly interacting in the ground state (M-M distance ≧3 Å) is likely to have an excimer like excited state. Generally, an excimer is formed when individual lumophores are bound in the excited state but not bound in the ground state. An excimer is a dimer with an excited state wavefunction that extends over two molecules or constituent species. For the purposes of the present invention, a "constituent species" refers to an individual metal complex, i.e., a metal center and the ligands to which it is attached. For the binuclear emissive materials of the present invention, the two metal complexes that comprise the excimer are held in relatively close proximity by virtue of the bridging ligands. The excited state wavefunction in this system extends over both metal complexes and generally leads to a marked decrease in the internuclear spacing. When the excited state relaxes the two parts of the molecule repel each other and the system returns to the higher internuclear separation found in the ground state. This weakly interacting system does not represent a true excimer, since the two constituent species can not completely dissociate, due the constraints of the bridging ligands. The photophysics is an excimer-like process however, i.e. excitation of one of the metal complexes, extension of the excited state wave function to both metal complexes, contraction, relaxation (emitting light) and finally, expansion.

A binuclear species having strongly interacting metal complexes may exhibit different photophysics. In this case, the ground state configuration may involve the formation of an M-M bonding orbitals. For $d^8$ metal complexes, this bonding orbital involves the contribution of two electrons from each metal center, forming filled σ bonding and (σ antibonding (σ*) orbitals, leading to a net bond order for this interaction of 0. This bonding picture has been described previously and is well known to those skilled in the art. See, Siu-Wai Lai et al., "Probing d 8-d 8 Interactions in Luminescent Mono- and Binuclear Cyclometalated Platinum(II) Complexes of 6-Phenyl-2,2'-bipyridines," Inorg. Chem. (1999) 38, 4046-4055; Mann et al., "Characterization of Oligomers of Tetrakis(phenyl isocyanide)rhodium(I) in Acetonitrile Solution," J. Am. Chem. Soc. (1975) 97, 3553-3555, each of which are incorporated by reference.

In the ground state, the highest filled orbital is generally the σ* orbital. The photophysics for this situation involves the promotion of an electron from the M-M σ* orbital to a π* orbital of the ligand or a higher lying M-M bonding orbital.

When the accepting orbital is the π* orbital, the transition is referred to as an MMLCT (metal-metal-to-ligand-charge-transfer). The π* orbital is the same state involved in the MLCT transition of a monomeric version of the binuclear complex, and is generally associated with a "photoactive ligand." Some contraction of the M-M distance is expected in the MMLCT excited state, since the σ* orbital is depopulated, but the nature of the transition is very different than the excimer-like transition described for the weakly interacting system. See, Novozhilova et al., "Theoretical Analysis of the Triplet Excited State of the [Pt2(H2P2O5)4]4-Ion and Comparison with Time-Resolved X-ray and Spectroscopic Results," J. Am. Chem. Soc. (2003) 125, 1079-1087; Rice et al., "Electronic Absorption and Emission Spectra of Binuclear Platinum(II) Complexes. Characterization of the Lowest Singlet and Triplet Excited States of Pt2(H2P2O5) 44-," J. Am. Chem. Soc. (1983) 105, 4571-4575, each of which is incorporated by reference.

While excitation of the weakly interacting system is the same as a monomeric version, the MMLCT gives rise to a new absorption for the σ* to π* transition, which is not present in the absorption spectrum of the monomeric complex. For example, this new band is seen in the excitation spectra of the binuclear Pt complex $(F_2ppy)_2Pt_2(SPy)_2$ at 500 nm (see FIG. 4).

A binuclear material may have some degree of metal-metal bonding that occurs in the ground state. Practically, it can be difficult to determine whether the constituent species comprising the binuclear emitter are directly bound in the ground state or not, when doped into molecular thin films, of the type used for the fabrication of OLEDs. It may be the case for some emitters that the truth is somewhere between the extremes. For example, the constituent species comprising the binuclear emitter may have a weak metal-metal bond in the ground state, but in the excited state the bond shortens and the species becomes strongly bound. In this case, the emitter is not a "true" excimer, as the constituent species are bound in the ground state. The constituent species may well be involved in both π-π stacking and metal-metal interactions in the doped films, leading to either excimer or MMLCT excited states. Thus, the term "excimer" as used herein may in some cases refer to constituent species having strongly bound excited states and weakly bound ground states.

The excimer energy is lower than that of an exciton localized on either of the two constituent species that make it up and its emission is typically relatively broad. Since excimers lack a bound ground state, they provide a unique solution to the achievement of efficient energy transfer from the charge-carrying host matrix to the light emitting centers. Indeed, for the case of two emitting materials, use of an excimer prohibits energy transfer between the two emitters, eliminating complicated intermolecular interactions, which make color balancing using multiple dopants problematic. For a review of the properties of excimers and excitons see Andrew Gilbert and Jim Baggott, *Essentials of Molecular Photochemistry*, 1991, CRC Press, Boston, pp. 145-167.

The photoactive ligand is referred to as photoactive because it is believed that it contributes to the photoactive properties of the emissive material by providing a π* orbital for an electron. Whether an electron is ionized from a ligand-based π* orbital, or moves from a metal-based orbital to the ligand-based orbital, the ligand is considered photoactive. The photoactive ligand may be bidentate or tridentate, wherein the terms bidentate and tridentate refer to the number of bonds the ligand has to a single metal center. For the photoactive ligand, preferably at least one of the bonds to the metal center will be a carbon-metal bond. In a preferred embodiment of the invention, the photoactive ligands comprise one or more aromatic rings. In some embodiments of the present invention, a first photoactive ligand coordinated to a first metal center and a second photoactive ligand coordinated to a second metal center are held in proximity by the bridging ligand(s) and the first and second metal centers allowing for a π-π interaction between the first and second photoactive ligands. Any suitable photoactive ligand may be used. In some embodiments, the first and second photoactive ligands may have the same structure.

In one embodiment of the present invention, the binuclear emissive compound comprises two metal centers, wherein each metal center is bound to a tridentate photoactive ligand and to one of the binding sites of a bridging ligand to give a compound of formula I

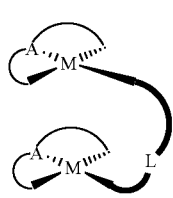
(I)

wherein A is a tridentate photoactive ligand, L is a bridging ligand and each M is a metal center. In this embodiment the metal centers each have a square planar configuration. The photoactive tridentate ligand, A, is bound to the metal center through three bonds, at least one of which is a carbon-metal bond and the remaining bonds to the metal being donative (heteroatom-metal) bonds. Preferred tridentate ligands are tricyclic aromatic compounds. In one embodiment of the invention, A is a tridentate photoactive ligand of the formula II$_a$

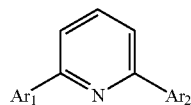
(IIa)

wherein Ar$_1$ is a five or six membered azacyclic ring, wherein the ring has a nitrogen atom at the 2-position that is capable of forming a donative bond to the metal center. The 2-position is defined herein as the position adjacent in the ring to the bond to the central pyridine ring. In a preferred embodiment, Ar$_1$ is pyridine or a substituted pyridine and Ar$_2$ is phenyl or a substituted phenyl.

In another embodiment of the invention, A is a tridentate photoactive ligand of the formula II$_b$

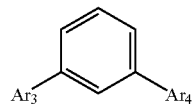
(II$_b$)

wherein Ar$_3$ and Ar$_4$ are independently selected five or six membered azacyclic rings, wherein each ring has a nitrogen atom at the 2-position that is capable of forming a donative bond to the metal center. In a preferred embodiment, one of the rings Ar$_3$ and Ar$_4$ is pyridine or a substituted pyridine. In a particularly preferred embodiment, both Ar$_3$ and Ar$_4$ are pyridine or a substituted pyridine.

In one embodiment of the present invention, the binuclear emissive compound comprises two metal centers, wherein each metal center is bound to a bidentate photoactive ligand and to two bridging ligands to give a compound of formula III:

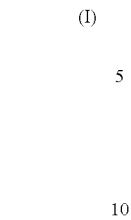

wherein A' is a bidentate photoactive ligand, L is a bridging ligand and M is a metal center. The bidentate photoactive ligand, A', has one metal-carbon bond and one donative (heteroatom-metal) bond, and can be selected from a wide variety known to the art. In a particularly preferred embodiment, A' is selected from 2-phenylpyridine and derivatives thereof. Many preferred bidentate photoactive ligands include the following partial structure, coordinated with the metal, so as to form a cyclometallated organometallic compound such as disclosed in US-2003-0017361, which is incorporated in its entirety by reference, as shown:

M may be any suitable metal, for example a d7, d8 or d9 metal, and the dotted lines represent bonds to the rest of the photoactive ligand.

In one embodiment of the invention, the binuclear emissive compound comprises two metal centers bound by bridging ligands. This embodiment may not have any photoactive ligands. For example, the two metal centers may be bound by four bridging ligands to give a compound of the formula IV:

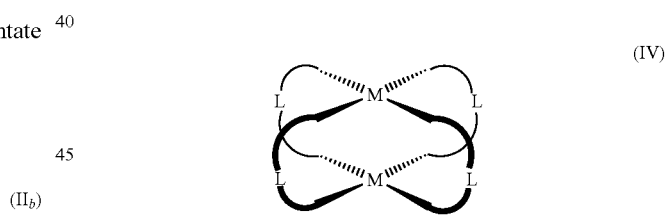
(IV)

wherein M is a metal center and L is a bridging ligand.

Where a compound having two metal centers, including binuclear compounds, does not have any photoactive ligands, light emission may occur by a mechanism that does not involve a π* orbital associated with a photoactive ligand. Specifically, the HOMO of a binuclear compound that does not have any photoactive ligands may also be a σ* orbital, composed predominantly of metal d$_{z^2}$ orbitals. The LUMO in the unexcited state may be a σ$_p$ orbital (σ bonding orbital formed by overlap of high lying metal p$_z$ orbitals), such that an excited state may occur when an electron moves from the σ* orbital to the σ$_p$ orbital. Such a transition may reduce the distance between the two metal centers for two reasons, first because the anti-bonding σ* orbital becomes depopulated and second because the bonding σ$_p$ orbital becomes populated. Emission may occur by relaxation of an electron from the σ$_p$ orbital to the σ* orbital. This type of emission is expected to be phosphorescent.

Generally, a molecule having a photoactive ligand will have a LUMO associated with a π* orbital, not the $\sigma_p$ orbital. Many previous efforts to obtain phosphorescent blue-emitting materials involved tuning the difference between a π* orbital associated with a photoactive ligand and a $\sigma_p$ orbital. Embodiments of the present invention allow blue materials to be obtained by designing a binuclear or multinuclear molecule without a photoactive ligand, such that the LUMO is no longer a π* orbital. Rather, the LUMO is a $\sigma_p$ orbital, and the emission spectra is determined by the energy difference between the σ* and $\sigma_p$ orbitals. This energy difference may be tuned in several ways. First, the distance between the metal centers may be controlled through selection of the bridging ligands. This distance has a strong effect on the energy difference between the σ* and $\sigma_p$ orbitals, and hence the emission spectra. All else being equal, smaller distances will generally result in lower energies and red-shifted emission, while greater distances will result in higher energies and blue-shifted emission. Second, the bridging ligands may be selected to tune the electronic structure of the metal centers. For example, the σ* and $\sigma_p$ orbitals in a binuclear molecule are the result of an interaction between the dz orbitals of the individual metals centers. Some bridging ligands may significantly influence the energies of metal d and p orbitals though ligand field interactions. Such ligand field "tuning" of orbital energies may lower or raise the energies of the individual metal d and p orbitals, depending on the nature of the bridging ligand and the bonding arrangement. Thus, it is possible that such ligand field effects could increase the energy difference between the atomic orbitals of the two metal centers and increase the energy difference between the σ* orbital and the $\sigma_p$ orbital, thereby blue-shifting the emission spectrum of the molecule.

In a preferred embodiment, a binuclear emissive material has two metal centers bound to each other by four bridging ligands, with no photoactive ligands. The metal centers preferably have four coordination sites. Pt is a preferred metal for the metal centers, because it has four coplanar coordination sites.

Preferably, the metal centers of a binuclear emissive material have at least 3 coordination sites, and more preferably at least 4 coordination sites. It is believed that materials having metal centers with 3 or 4 coordination sites tend to be more stable than materials having fewer coordination sites. It is believed that metal centers having at least 4 coordination sites may tend to be particularly stable. A metal having exactly 4 coordination sites in a coplaner arrangement, such as Pt, may lead to particularly stable binuclear molecules.

The compounds of embodiments of the present invention comprise two metal centers. The metals may be selected from the heavy metals with an atomic weight greater than 40. The preferred electronic configuration of the metal center has eight d electrons (e.g. Pt(II), Pd(II), Ni(II), Ir(I), Rh(I), Ag(III), Au(III), etc.), but the invention is not limited to these metals or oxidation states. These metal centers are referred to as "d8" metal centers. d8 metal centers are preferred because there is generally a strong interaction between two d8 metal centers, even though there is no bond in the ground state. Pt is a particularly preferred d8 metal center. Other electronic configurations that may be used include metal centers having 7 d electrons ("d7" metal centers), and metal centers having 9 d electrons ("d9" metal centers). d10 metal centers are not preferred, because they generally have a long interaction and no bond in the ground state. In some embodiments, a binuclear complex may be formed from two metals having a different number of d electrons, i.e., a d7 metal may be paired with a d8 metal. Preferably, the two metals have the same number of d electrons. Most preferably, for ease of fabrication, the two metal centers of a binuclear complex are the same metal.

In some embodiments, an emissive material is a binuclear charge-neutral compound. Charge neutral compounds are preferred for some applications because they are easier to sublime and vacuum deposit, such that device fabrication by certain methods is facilitated. Compounds that are not charge-neutral may be used in other embodiments, but sublimation of such compounds may be difficult such that solution processing is preferred for such compounds.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:

As used herein, abbreviations refer to materials as follows:

| | |
|---|---|
| CBP: | 4,4'-N,N-dicarbazole-biphenyl |
| m-MTDATA | 4,4',4"-tris(3-methylphenylphenylamino)triphenylamine |
| Alq$_3$: | 8-tris-hydroxyquinoline aluminum |
| Bphen: | 4,7-diphenyl-1,10-phenanthroline |
| n-BPhen: | n-doped BPhen (doped with lithium) |
| F$_4$-TCNQ: | tetrafluoro-tetracyano-quinodimethane |
| p-MTDATA: | p-doped m-MTDATA (doped with F$_4$-TCNQ) |
| Ir(ppy)$_3$: | tris(2-phenylpyridine)-iridium |
| Ir(ppz)$_3$: | tris(1-phenylpyrazoloto,N,C(2')iridium(III) |
| BCP: | 2,9-dimethyl-4,7-diphenyl-1,10-phenanthroline |
| TAZ: | 3-phenyl-4-(1'-naphthyl)-5-phenyl-1,2,4-triazole |
| CuPc: | copper phthalocyanine |
| ITO: | indium tin oxide |
| NPD: | naphthyl-phenyl-diamine |
| TPD: | N,N'-bis(3-methylphenyl)-N,N'-bis-(phenyl)-benzidine |
| BAlq: | aluminum(III)bis(2-methyl-8-quinolinato)4-phenylphenolate |
| mCP: | 1,3-N,N-dicarbazole-benzene |
| DCM: | 4-(dicyanoethylene)-6-(4-dimethylaminostyryl-2-methyl)-4H-pyran |
| DMQA: | N,N'-dimethylquinacridone |
| PEDOT:PSS: | an aqueous dispersion of poly(3,4-ethylenedioxythiophene) with polystyrenesulfonate (PSS) |

-continued

| | |
|---|---|
| FPt: | Platinum(II) (2-(4-,6-difluorophenyl)pyridinato-N,C$^2$) (2,4-pentanedionato-O,O) |
| FPtdpm: | Platinum(II) (2-(4-,6-difluorophenyl)pyridinato-N,C$^2$) (2,2,6,6-tetramethyl-3,5-heptanedionato-O,O) |
| (F$_2$ppy)$_2$Pt$_2$(SPy)$_2$: | di-Platinum(II), bis(2-(4-,6-difluorophenyl)pyridinato-N,C$^2$) bis[:-(2-pyridinethionato-N1:S2)] |
| Pt$_2$Spy$_4$: | di-Platinum(II), tetrakis[:-(2-pyridinethionato-N1:S2)] |
| Spy: | 2-thiopyridine |

Experimental:

Specific representative embodiments of the invention will now be described, including how such embodiments may be made. It is understood that the specific methods, materials, conditions, process parameters, apparatus, and the like do not necessarily limit the scope of the invention.

EXAMPLE 1

2-Mercaptopyridine (0.53 g, 4.80 mmol) was added to a methanolic solution of 4,6-dfppyPtdimer (2.00 g, 2.38 mmol), as described in Brooks et al., "Synthesis and Characterization of Phosphorescent Cyclometalated Platinum Complexes," Inorganic Chemistry, 2002, 41(12), 3055-3066, which is incorporated by reference in its entirety. Potassium carbonate (0.50 g) was added to the solution and heated to 60° C. for 18 hours. The solution was then cooled and the solvent was removed under reduced pressure. The crude product was dissolved in acetone and passed through a silica gel column with acetone as the eluent. The solvent was once again removed under reduced pressure and the product was recrystallized from methanol to give an 82% yield of (F$_2$ppy)$_2$Pt$_2$(SPy)$_2$ as a red crystalline compound.

EXAMPLE 2

A glass substrate was prepared by washing with detergent and rinsing with deionized water followed by acetone. The glass was then dried under a stream of nitrogen and then placed in an ozone oven for 10 minutes. A 100 ml solution of (F$_2$ppy)$_2$Pt$_2$(SPy)$_2$/CBP was prepared (solution A) by dissolving 5.00 mg (F$_2$ppy)$_2$Pt$_2$(SPy)$_2$ and 100 mg of CBP in toluene in a 100 ml volumetric flask. A 100 ml solution of FPt/CBP was prepared (solution B) by dissolving 5.00 mg FPt and 100 mg of CBP in toluene in a 100 ml volumetric flask. Two thin films were prepared from these solutions. Solution A was spincoated on the glass substrate at 40,000 rpm for 40 seconds to give the (F$_2$ppy)$_2$Pt$_2$(SPy)$_2$ thin film. Solution B was spincoated on another glass substrate at 40,000 rpm for 40 seconds to give the FPt thin film.

Figure 3:
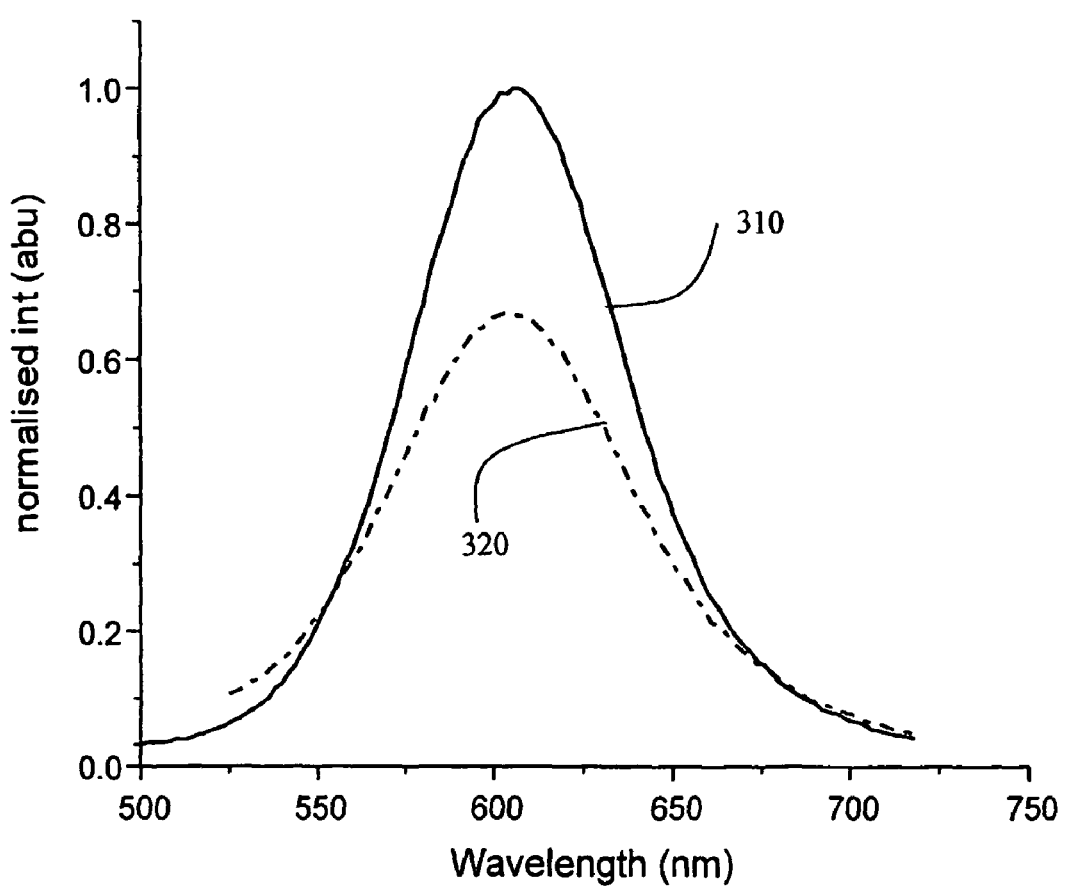
FIG. 3 shows the photoluminescent emission spectrum of a thin film of $(F_2ppy)_2Pt_2(SPy)_2$ doped at 5% into a CBP.

The thin film of (F$_2$ppy)$_2$Pt$_2$(SPy)$_2$ doped in CBP was excited with two spectra, one peaking at 370 nm and the other peaking at 500 nm. These two spectra were selected to roughly coincide with the absorption spectra of CBP and (F$_2$ppy)$_2$Pt$_2$(SPy)$_2$, respectively. The resultant PL spectra are shown in FIG. 3. Plot 310 shows the PL spectra for excitation at 370 nm. Plot 320 shows the PL spectra for excitation at 500 nm. The plot for excitation at 370 nm shows that energy absorbed by the CBP may be transferred to the (F$_2$ppy)$_2$Pt$_2$(SPy)$_2$ and emitted as light.

Figure 4:
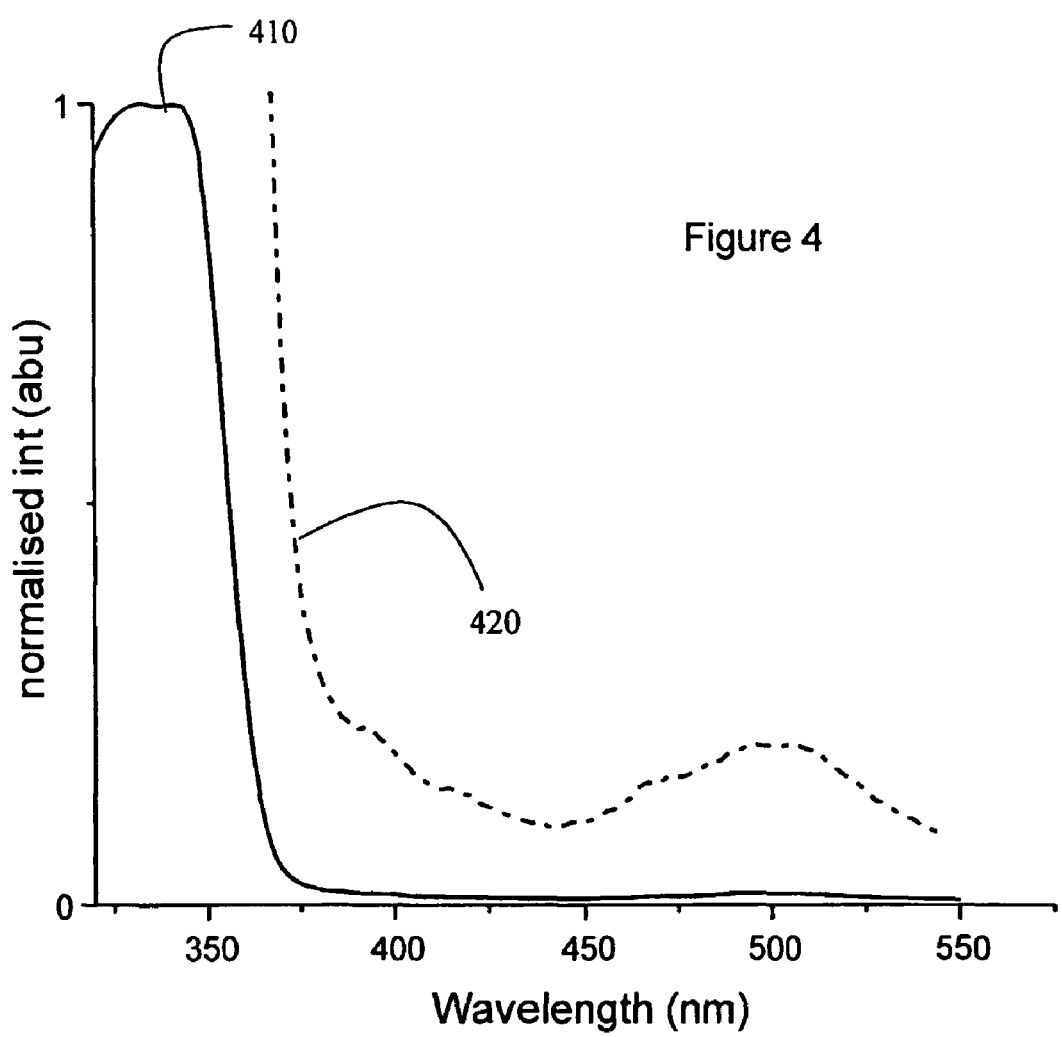
FIG. 4 shows the excitation spectra of a thin film of $(F_2ppy)_2 Pt_2(SPy)_2$ doped at 5% in CBP with emission set at 605 nm. The absorption band at 500 nm can be seen.

FIG. 4 shows the excitation spectra of the thin film of (F$_2$ppy)$_2$Pt$_2$(SPy)$_2$ doped at 5% in CBP with emission set at 605 nm. Plot 420 is based on the same data as plot 410, but the values have been multiplied by 20 so that more detail can be seen. The peak around 350 nm, most clearly visible in plot 410, is due to absorption by CBP. The peak around 500 nm, most clearly visible in plot 420, is due to absorption by (F$_2$ppy)$_2$Pt$_2$(SPy)$_2$, and demonstrates an interaction between the two Pt metal centers in the ground state.

Figure 5:
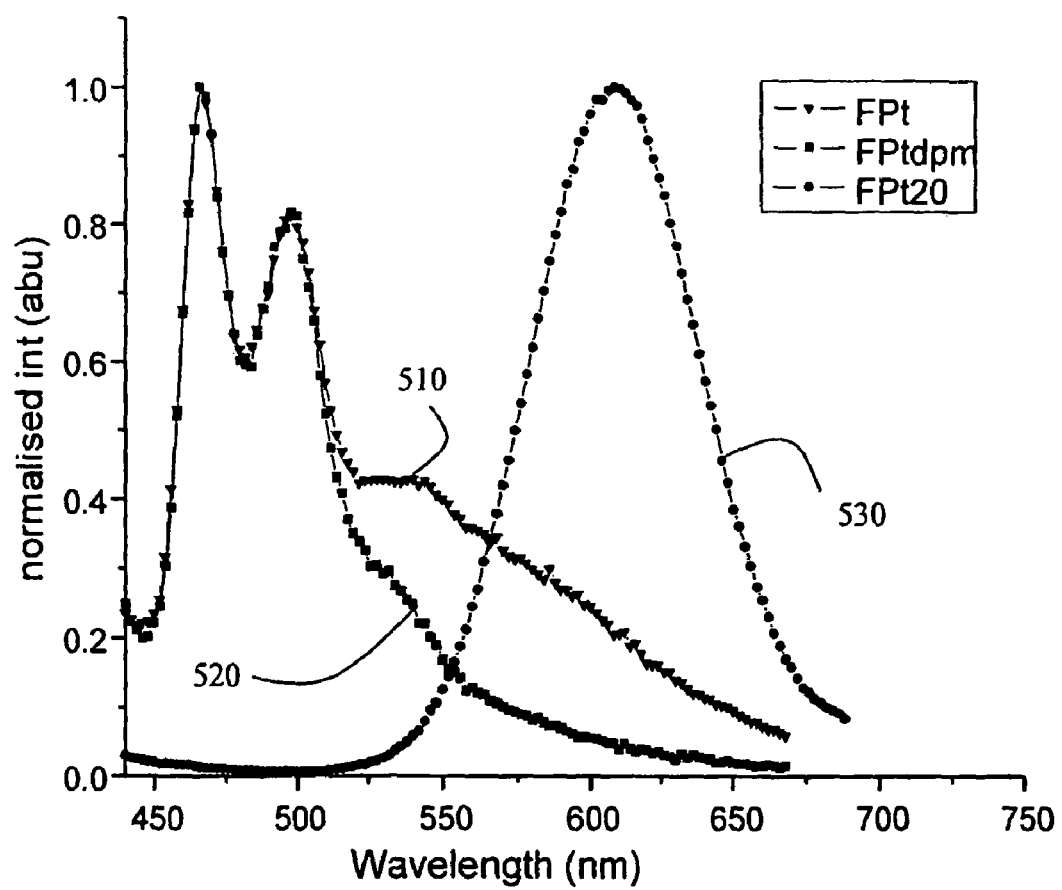
FIG. 5 shows a comparison of the emission spectra of FPt, FPtdpm and $(F_2ppy)_2Pt_2(SPy)_2$. Photoluminescent films of FPt, FPtdpm and $(F_2ppy)_2Pt_2(SPy)_2$ in CBP, each doped at 5%, were prepared by spin coating and were excited at 370 nm.

FIG. 5 shows a comparison of the emission spectra of FPt, FPtdpm and (F$_2$ppy)$_2$Pt$_2$(SPy)$_2$. Photoluminescent films of FPt, FPtdpm and (F$_2$ppy)$_2$Pt$_2$(SPy)$_2$ in CBP, each doped at 5%, were prepared by spin coating as described above and were excited at 370 nm. The PL spectra for FPt, FPtdpm and (F$_2$ppy)$_2$Pt$_2$(SPy)$_2$, respectively, are shown as plots 510, 520 and 530.

EXAMPLE 3

Figure 6:
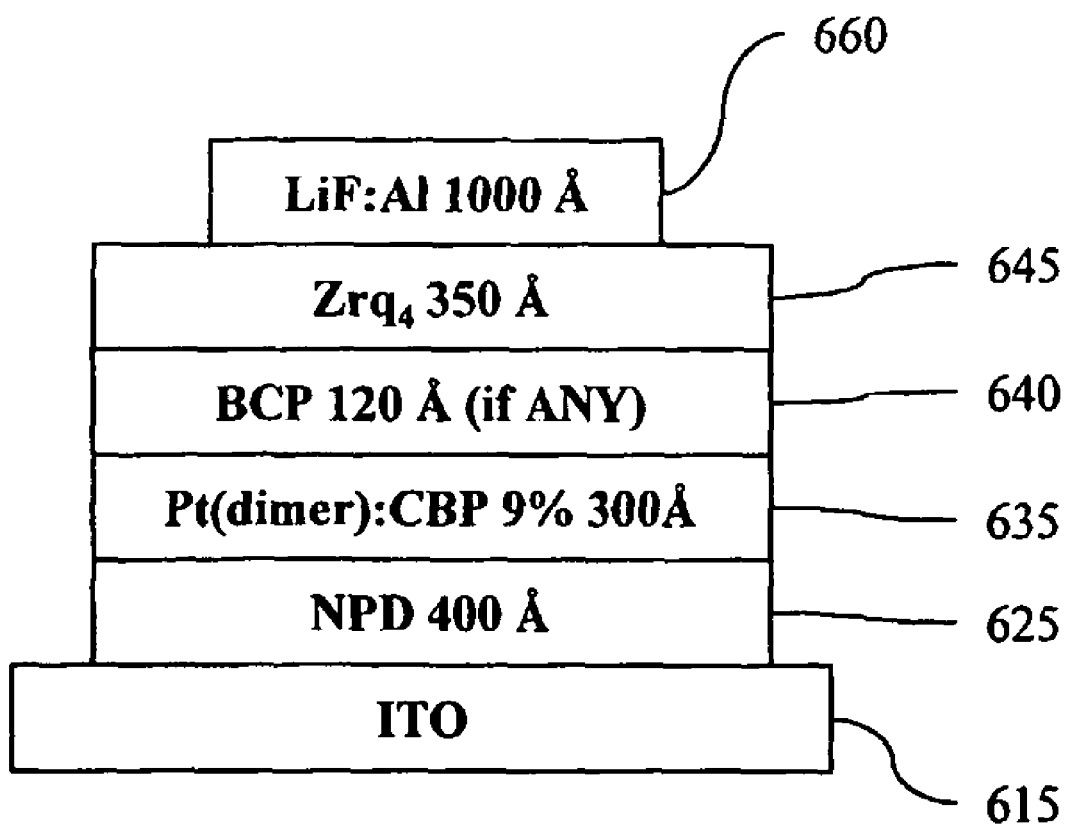
FIG. 6 shows a schematic representation of the device ITO/NPD (400 Å)/binuclear complex, 9%: CBP (300 Å)/BCP (120 Å, optional)/$Zrq_4$ (350 Å)/Li:Al (1000 Å).
Figure 11:
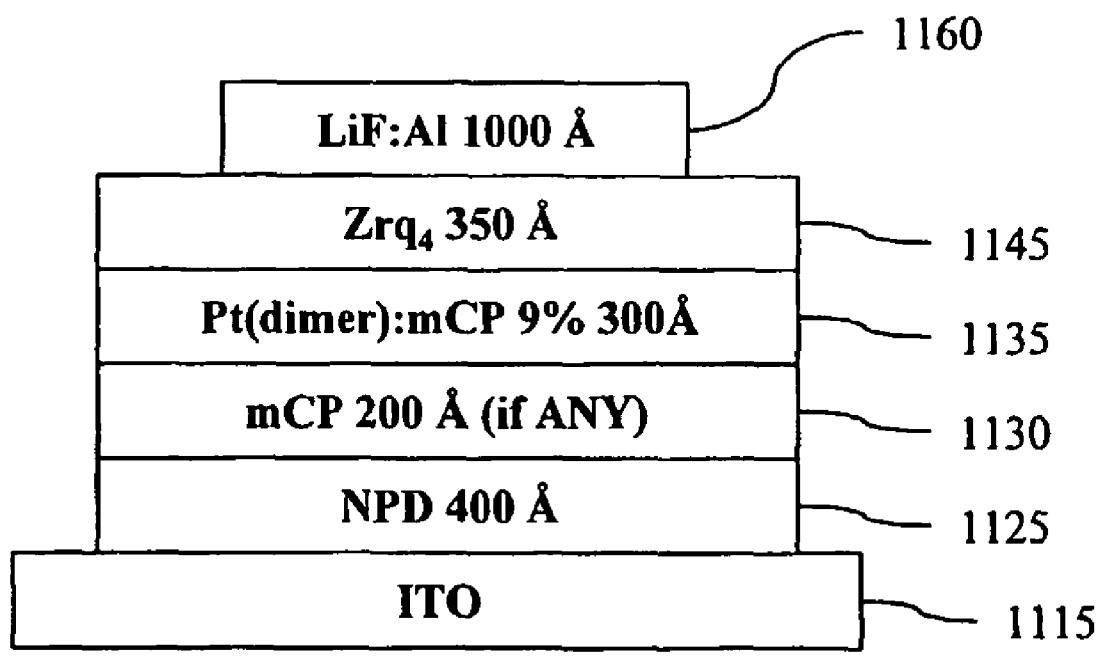
FIG. 11 show a schematic representation of the device ITO/NPD (400 Å)/mCP (200 Å, optional)/binuclear complex, 9%: mCP (300 Å)/$Zrq_4$ (350 Å)/Li:Al (1000 Å).

Organic light emitting devices were grown on a glass substrate pre-coated with a ~100 nm thick layer of indium-tin-oxide (ITO) having a sheet resistance of ~20 Ω/□. Substrates were degreased with solvents and then cleaned by exposure to UV-ozone ambient for 10 minutes. After cleaning, the substrates were immediately loaded into a thermal evaporation system operating at a base pressure of ~1×10$^{-6}$ Torr. Several different device structures were fabricated, as illustrated in FIGS. 6 and 11. First, a 400-Å-thick 4-4'-bis[N-(1-naphthyl)-N-phenyl-amino]biphenyl ((α-NPD) hole transport layer (HTL) were deposited. In some devices, a 200 Å thick layer of mCP was deposited as an electron blocking layer (EBL). Next, 9% (F$_2$ppy)$_2$Pt$_2$(SPy)$_2$ (by weight) was codeposited with either mCP or CBP to form the 300-Å-thick emissive layer. In some devices, a 120 Å thick layer of BCP was deposited as an electron blocking layer (EBL). Finally, a 350-Å-thick electron transport layer (ETL) consisting of zirconium (IV) tetras (8-hydroxyquinoline) (Zrq$_4$) was deposited. Device cathodes consisting of a 10-Å-thick layer of LiF followed by a 1000-Å-thick layer of aluminum were deposited trough a shadow mask. The devices active area was 2×2 mm$^2$. The following four structures were fabricated:

Structure 1: ITO/NPD/(F$_2$ppy)$_2$Pt$_2$(SPy)$_2$:CBP/ZrQ$_4$/LiF:Al;

Structure 2: ITO/NPD/(F$_2$ppy)$_2$Pt$_2$(SPy)$_2$:CBP/BCP/ZrQ$_4$/LiF:Al;

Structure 3: ITO/NPD/(F$_2$ppy)$_2$Pt$_2$(SPy)$_2$:mCP/ZrQ$_4$/LiF:Al; and

Structure 4: ITO/NPD/mCP/(F$_2$ppy)$_2$Pt$_2$(SPy)$_2$:mCP/ZrQ$_4$/LiF:Al.

FIG. 6 shows a schematic representation of devices having structures 1 and 2. Structure 1 has an anode 615, a hole transport layer 625, an emissive layer 635, an electron transport layer 645, and a cathode 660. Structure 2 is the same as structure 1, but has an additional hole blocking layer 640 disposed between emissive layer 635 and electron transport layer 645. The materials and thicknesses of the various layers were as indicated in the previous paragraphs.

Figure 7:
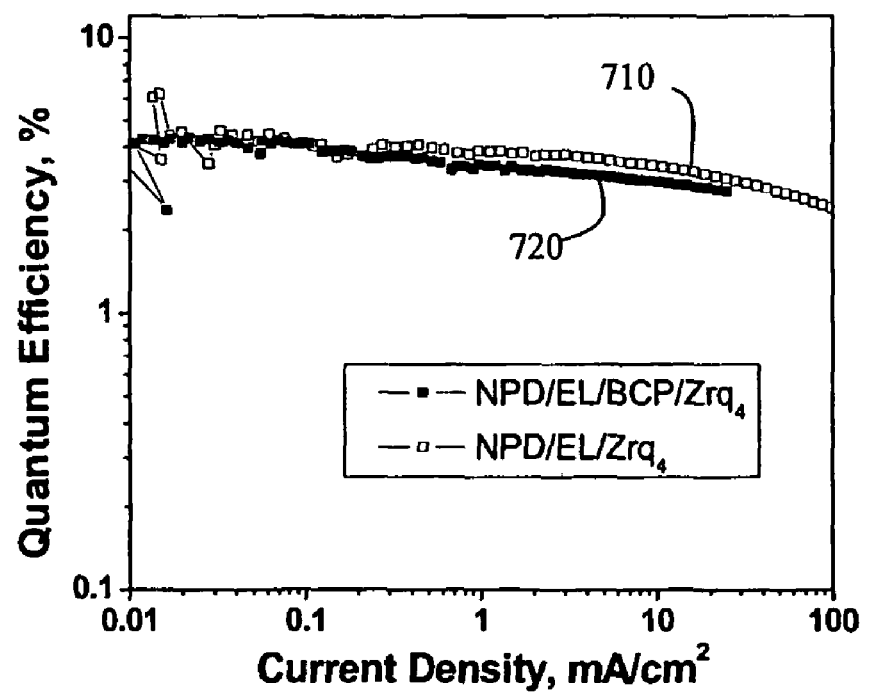
FIG. 7 shows plots of quantum efficiency against current density for devices having the structures illustrated in FIG. 6.

FIG. 7 shows plots of quantum efficiency against current density for devices having Structures 1 and 2. Plot 710 shows data for structure 1, and plot 720 shows data for structure 2. Both devices show a maximum quantum efficiency of about 6.0%.

Figure 8:
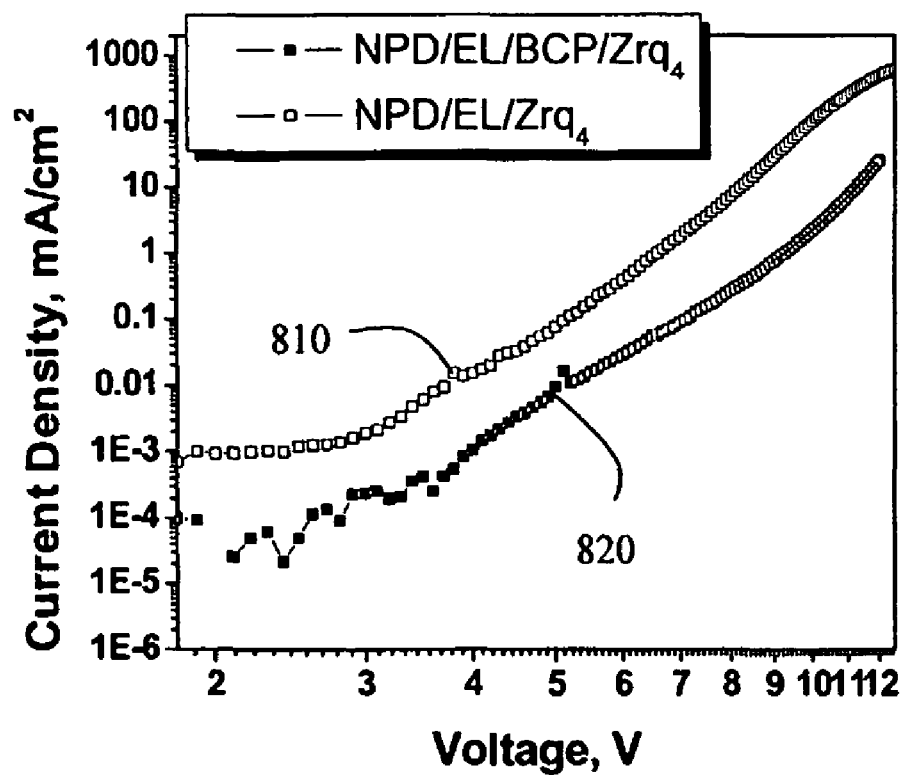
FIG. 8 shows plots of current density vs. voltage for devices having the structures illustrated in FIG. 6.

FIG. 8 shows plots of current density vs. voltage for devices having Structures 1 and 2. Plot 810 shows data for structure 1, and plot 820 shows data for structure 2.

Figure 9:
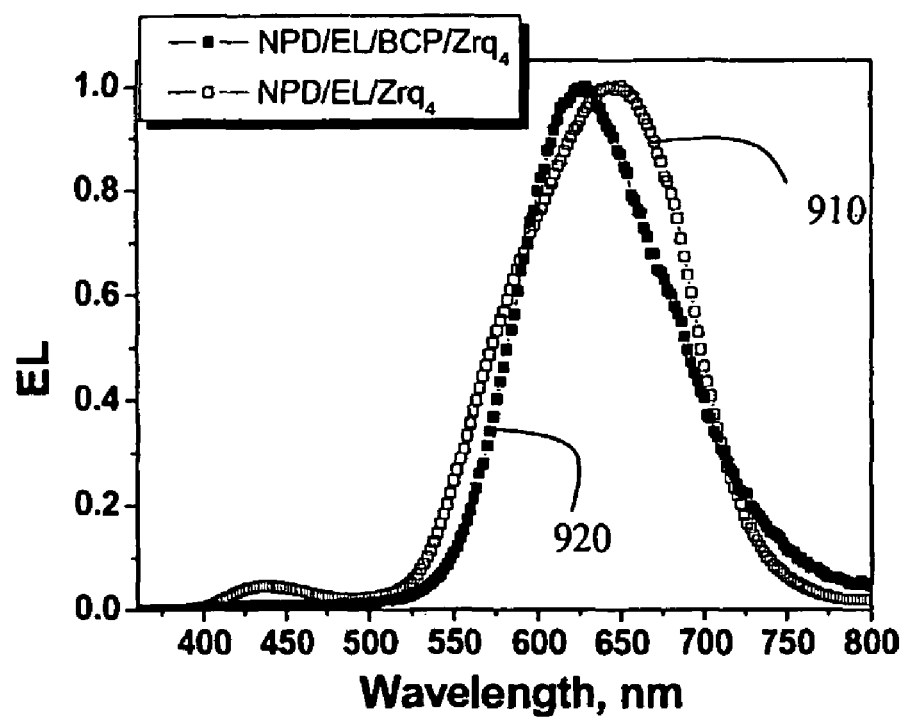
FIG. 9 shows plots of electroluminescent spectra for devices having the structures illustrated in FIG. 6.

FIG. 9 shows plots of electroluminescent spectra for devices having Structures 1 and 2. Plot 910 shows data for structure 1, and plot 920 shows data for structure 2.

Figure 10:
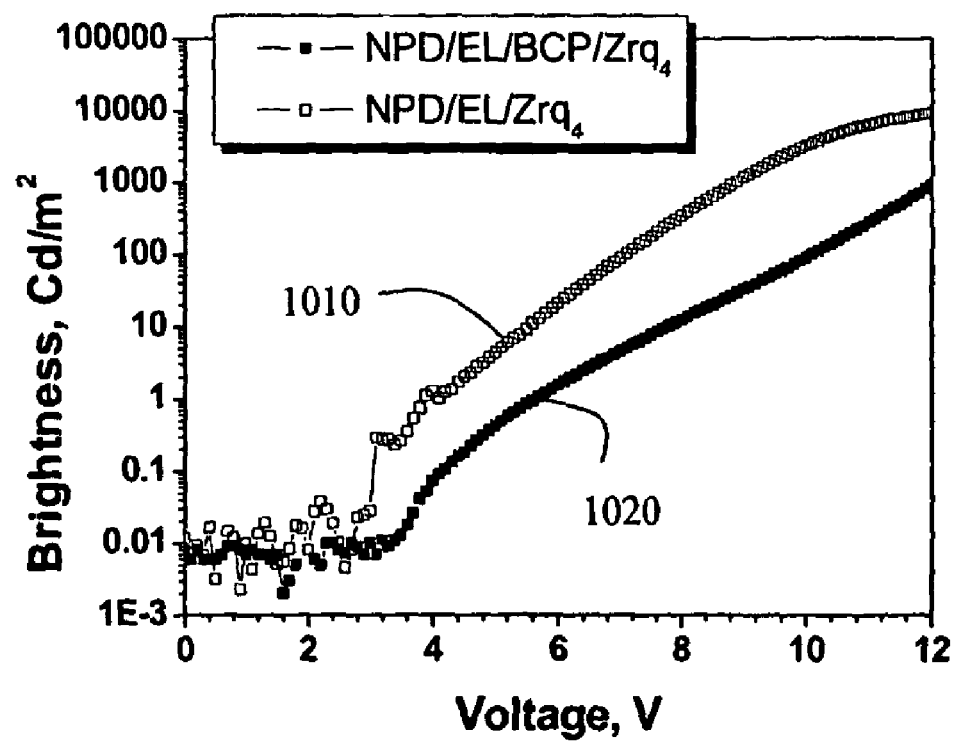
FIG. 10 shows plots of brightness vs. voltage for the devices having the structures illustrated in FIG. 6.

FIG. 10 shows plots of brightness vs. voltage for the devices having structures 1 and 2. Plot 1010 shows data for structure 1, and plot 1020 shows data for structure 2. Structure 1 shows a higher brightness at 6 volts of about 100 $Cd/m^2$.

FIG. 11 show a schematic representation of devices having structures 3 and 4. Structure 3 has an anode 1115, a hole transport layer 1125, an emissive layer 1135, an electron transport layer 1145, and a cathode 1160. Structure 4 is the same as structure 3, but has an additional electron blocking layer 1130 disposed between hole transport layer 1125 and emissive layer 1135. The materials and thicknesses of the various layers were as indicated in the previous paragraphs.

Figure 12:
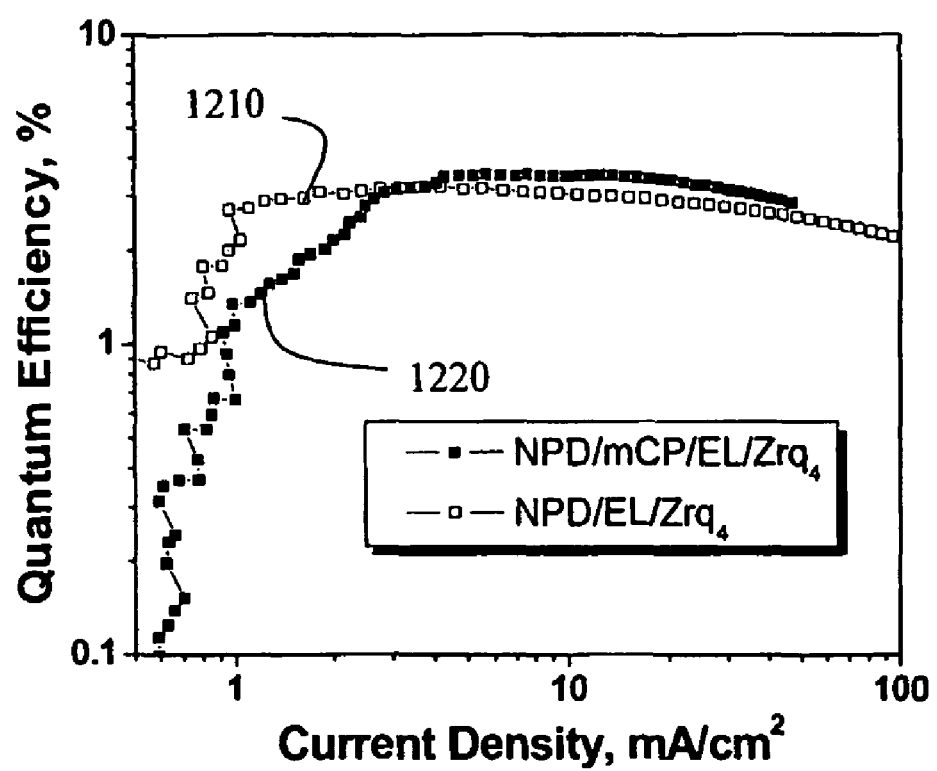
FIG. 12 shows plots of quantum efficiency against current density for devices having the structures illustrated in FIG. 11.

FIG. 12 shows plots of quantum efficiency against current density for devices having the structures NPD/mCP/EL/$Zrq_4$ and NPD/EL/$Zrq_4$ (Structures 4 and 3). Plot 1210 shows data for structure 3, and plot 1220 shows data for structure 4. Both devices show a maximum quantum efficiency of about 3.1%.

Figure 13:
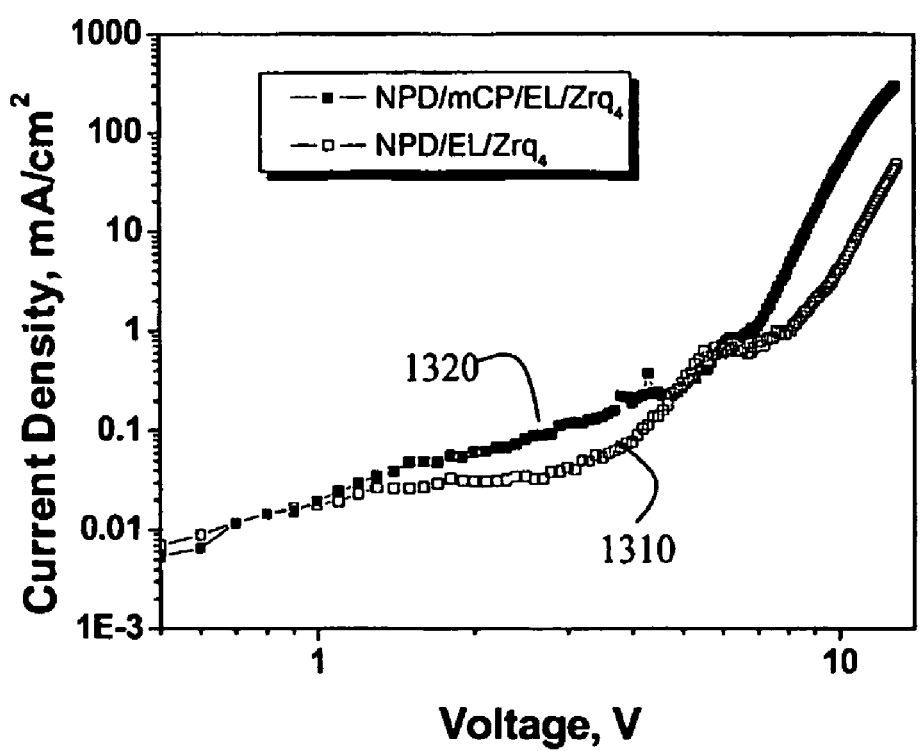
FIG. 13 shows plots of current density vs. voltage for devices having the structures illustrated in FIG. 11.

FIG. 13 shows plots of current density vs. voltage for devices having the structures NPD/mCP/EL/$Zrq_4$ and NPD/EL/$Zrq_4$ (Structures 4 and 3). Plot 1310 shows data for structure 3, and plot 1320 shows data for structure 4.

Figure 14:
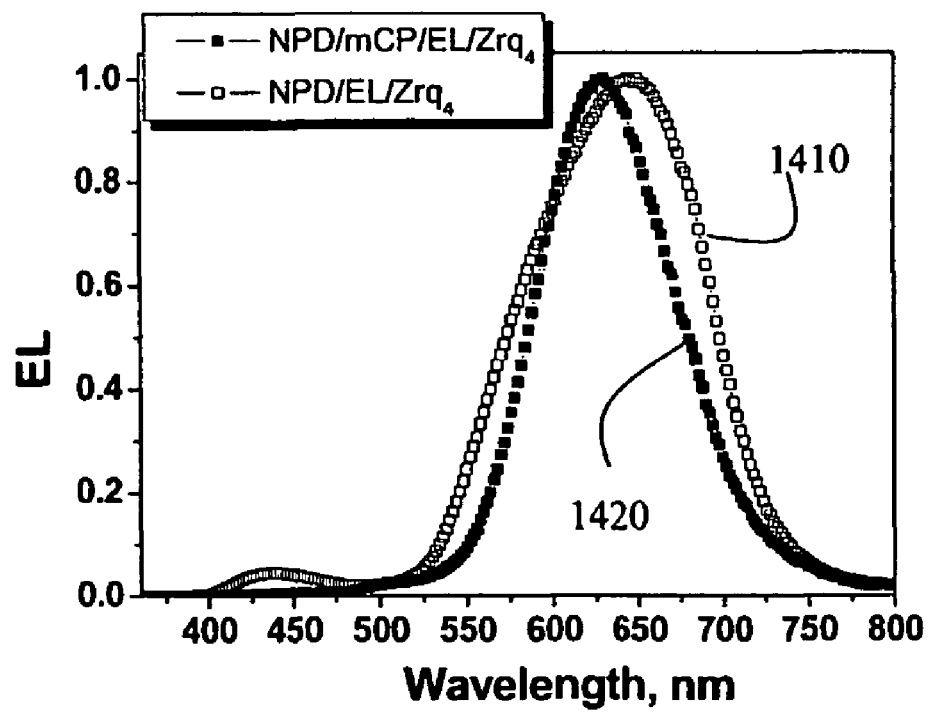
FIG. 14 shows plots of electroluminescent spectra for devices having the structures illustrated in FIG. 11.

FIG. 14 shows plots of electroluminescent spectra for devices having the structure NPD/mCP/EL/$Zrq_4$ and NPD/EL/$Zrq_4$ (Structures 4 and 3). Plot 1410 shows data for structure 3, and plot 1420 shows data for structure 4.

Figure 15:
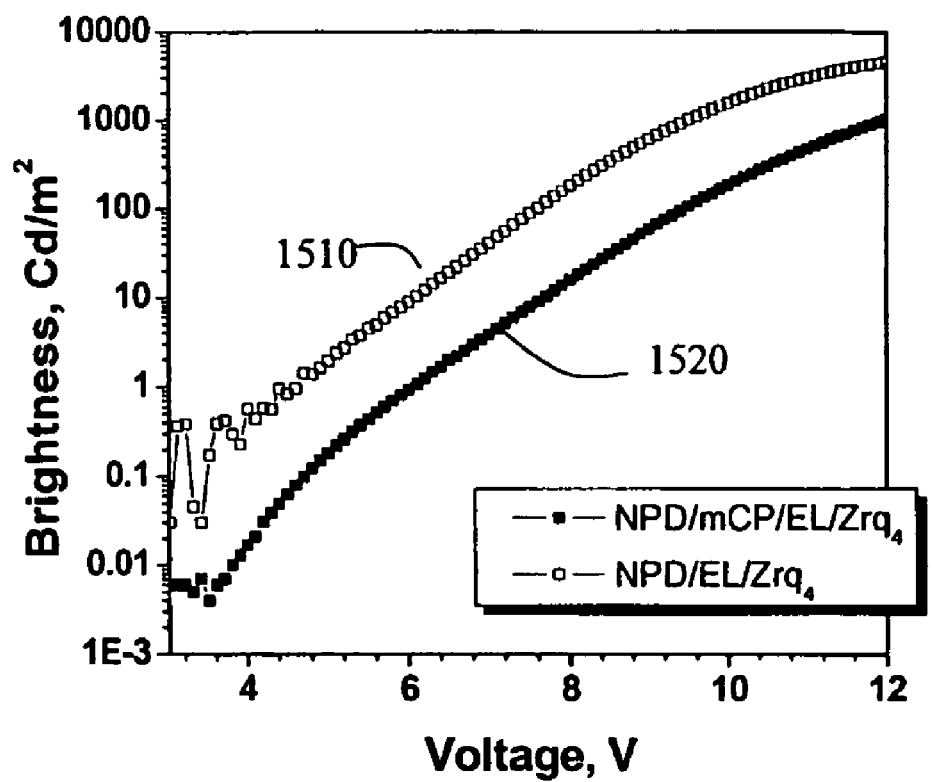
FIG. 15 shows plots of brightness vs. voltage for the devices having the structures illustrated in FIG. 11.

FIG. 15 shows plots of brightness vs. voltage for the devices having the structure NPD/mCP/EL/$Zrq_4$ and NPD/EL/$Zrq_4$ (Structures 4 and 3). Plot 1510 shows data for structure 3, and plot 1520 shows data for structure 4.

FIG. 16 shows the chemical structure of FPt, FPtdpm, and $(F_2ppy)_2Pt_2(SPy)_2$.

FIG. 17 shows the structure of $(F_2ppy)_2Pt_2(SPy)_2$ as determined by X-ray crystallography.

Pt2Spy4(n) and Spy(n) were prepared as described in Umakoshi et al., "Binuclear Platinum(II) and -(III) Complexes of Pyridine-2-thiol and Its 4-Methyl Analogue, Synthesis, Structure, and Electrochemistry," Inorg. Chem. 1987, 26, 3551-3556, which is incorporated by reference in its entirety.

Figure 18:
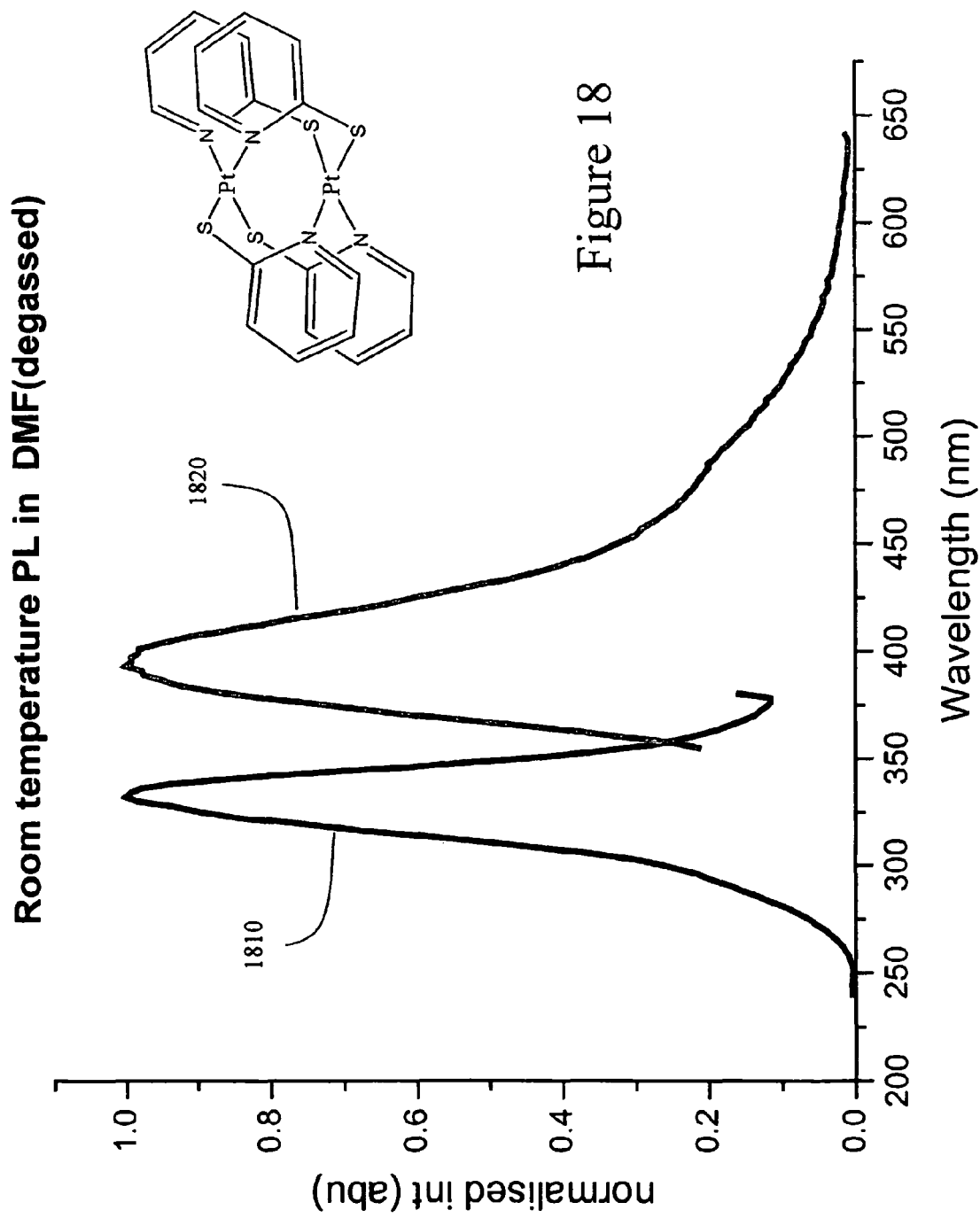
FIG. 18 shows PL emission spectra for $Pt_2Spy_4$ in solution.

FIG. 18 shows PL emission spectra for $Pt_2Spy_4$ at a concentration of less than 1 nmol in 2-methyl-tetra-hydro-furan (2-methyl-THF). Plot 1810 shows an emission peak for 2-methyl-THF, and plot 1220 shows an emission peak for $Pt_2Spy_4$. The peak of plot 1820 is around 400 nm, and the tail is significantly attenuated at 470 nm, demonstrating that it is possible to achieve deep blue emission with a binuclear material having no photoactive ligands.

Figure 19:
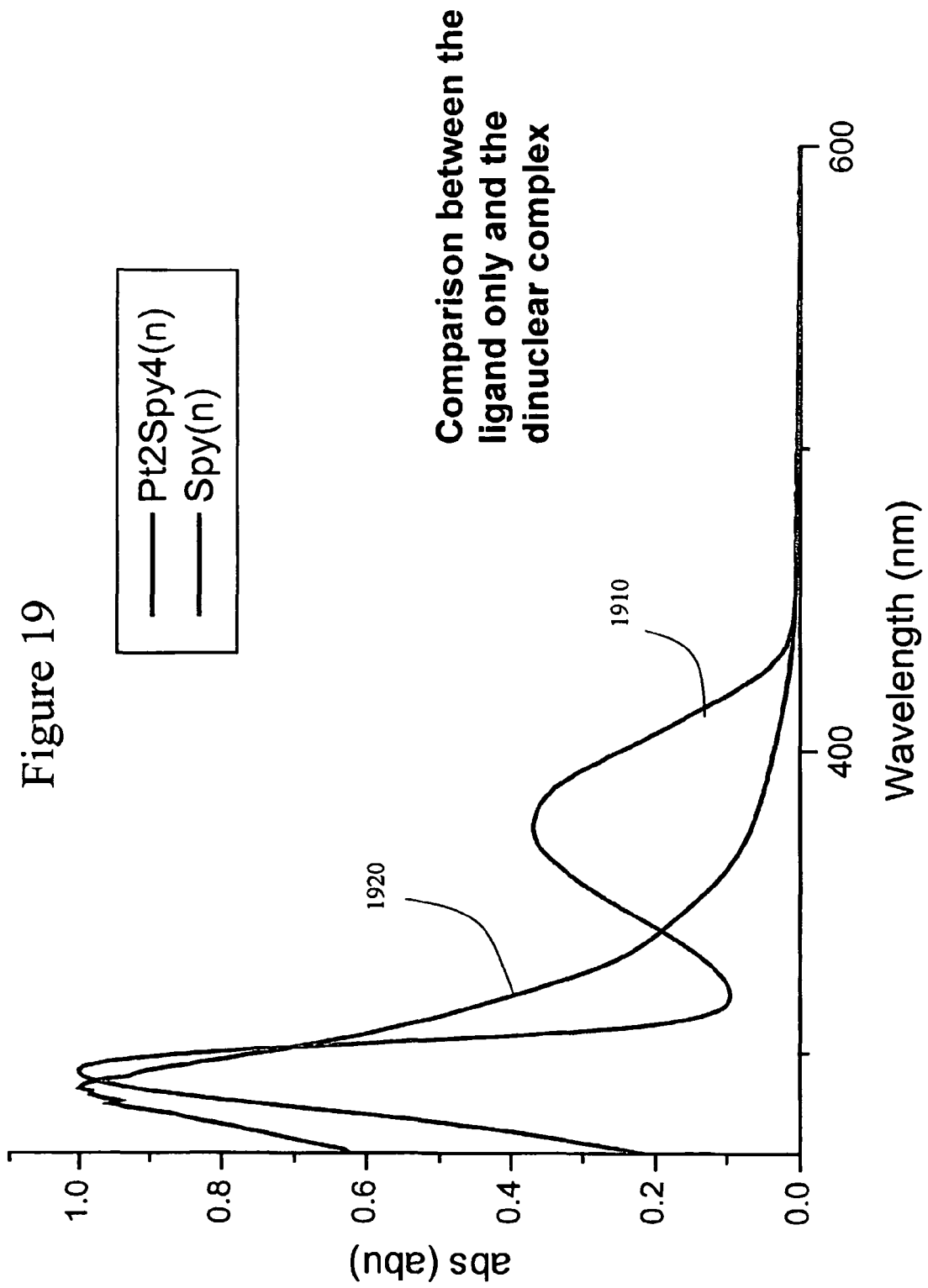
FIG. 19 shows absorption spectra for $Pt_2Spy_4$ and Spy in solution.

FIG. 19 shows absorption spectra for $Pt_2Spy_4$ and Spy in solution. Plot 1910 shows the absorption spectra for Spy. Plot 1920 shows the absorption spectra for $Pt_2Spy_4$.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art

What is claimed is:

1. An organic light emitting device, comprising:
   an anode;
   a cathode; and
   an emissive layer disposed between and electrically connected to the anode and the cathode, the emissive layer comprising an emissive material comprising:
   a first d8 metal center;
   a second d8 metal; and
   one or more bridging ligands, wherein each bridging ligand is coordinated to the first metal center and to the second metal center;
   wherein the distance between the first and second metal centers is less than 4 Å, and wherein the first and second metal centers are held in a co-facial configuration by the one or more bridging ligands.

2. An organic light emitting device, comprising:
   an anode;
   a cathode; and
   an emissive layer disposed between and electrically connected to the anode and the cathode, the emissive layer comprising an emissive material comprising:
   a first d8 metal center;
   a second d8 metal center; and
   a bridging ligand coordinated to the first metal center and to the second metal center, wherein the emissive material does not include a photoactive ligand.

3. An organic light emitting device, comprising:
   an anode;
   a cathode; and
   an emissive layer disposed between and electrically connected to the anode and the cathode, the emissive layer comprising a binuclear emissive material comprising:
   a first d8 metal center;
   a second d8 metal center; and
   a bridging ligand coordinated to the first metal center and to the second metal center, wherein the emissive material does not include a photoactive ligand;
   wherein the first and second metal centers are held in a co-facial configuration by the bridging ligand.

4. The device of claim 2, wherein the distance between the first and second metal centers is 4 Å or less.

5. The device of claim 4, wherein the first and second metal centers are held in a co-facial configuration by the bridging ligand.

6. The device of claim 5, wherein the first and second metal centers are held in a square planar configuration.

7. The device of claim 2, wherein the bridging ligand has the structure:

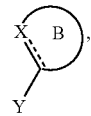

wherein B is a five- or six-membered ring, and wherein X and Y are each independently an atom capable of forming a donative bond with one of the metal centers.

8. The device of claim 7, wherein the bridging ligand is

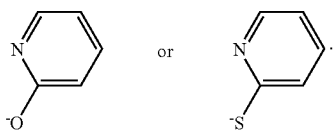

9. The device of claim 2, wherein the first and second metal centers each has four coordination sites, and wherein the emissive material further comprises four bridging ligands coordinated to the first and second metal centers.

10. The device of claim 9, wherein the first and second metal centers are each platinum.

11. The device of claim 9, wherein the emissive material has the following structure:

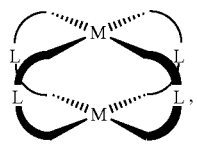

wherein each L is a bridging ligand, and wherein each M is a metal center.

12. The device of claim 11, wherein the emissive material is the following:

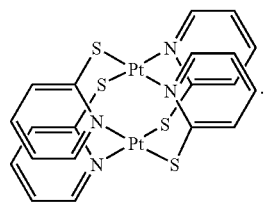

13. The device of claim 3, wherein the first and second metal centers are held in a square planar configuration.

14. The device of claim 3, wherein the distance between the first and second metal centers is 4 Å or less.

15. The device of claim 3, wherein the bridging ligand has the structure:

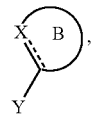

wherein B is a five- or six-membered ring, and wherein X and Y are each independently an atom capable of forming a donative bond with one of the metal centers.

16. The device of claim 15, wherein the bridging ligand is

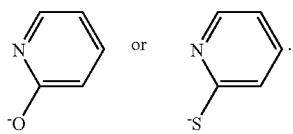

17. The device of claim 3, wherein the first and second metal centers are each platinum.

18. The device of claim 1, wherein the first and second metal centers are held in a square planar configuration.

19. The device of claim 1, wherein the emissive material has two or more bridging ligands.

20. The device of claim 1, wherein the emissive material has exactly four bridging ligands.

21. The device of claim 1, further comprising a photoactive ligand.

22. The device of claim 21, wherein the emissive material has exactly two bridging ligands and exactly two photoactive ligands.

* * * * *